(12) United States Patent
Park et al.

(10) Patent No.: US 7,936,590 B2
(45) Date of Patent: May 3, 2011

(54) DIGITALLY-CONTROLLABLE DELAY FOR SENSE AMPLIFIER

(75) Inventors: Dongkyu Park, San Diego, CA (US); Anosh B. Davierwalla, San Diego, CA (US); Cheng Zhong, San Diego, CA (US); Mohamed Hassan Soliman Abu-Rahma, San Diego, CA (US); Sei Seung Yoon, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 209 days.

(21) Appl. No.: 12/329,941

(22) Filed: Dec. 8, 2008

(65) Prior Publication Data

US 2010/0142303 A1    Jun. 10, 2010

(51) Int. Cl.
*G11C 11/00* (2006.01)
(52) U.S. Cl. .................. 365/158; 365/171; 365/173
(58) Field of Classification Search .......... 365/158, 365/171, 173
See application file for complete search history.

(56) References Cited

U.S. PATENT DOCUMENTS

| 5,841,719 A | 11/1998 | Hirata |
| 6,185,143 B1 * | 2/2001 | Perner et al. ........... 365/171 |
| 2004/0095800 A1 | 5/2004 | Lin et al. |
| 2005/0128860 A1 | 6/2005 | Hidaka |
| 2006/0077737 A1 | 4/2006 | Ooishi |

OTHER PUBLICATIONS

International Search Report—PCT/US2009/066999—International Search Authority—European Patent Office, Mar. 10, 2010.

* cited by examiner

*Primary Examiner* — Son Dinh
*Assistant Examiner* — Nam Nguyen
(74) *Attorney, Agent, or Firm* — Sam Talpalatsky; Nicholas J. Pauley; Jonathan T. Velasco (57) ABSTRACT

Circuits, apparatuses, and methods of interposing a selectable delay in reading a magnetic random access memory (MRAM) device are disclosed. In a particular embodiment, a circuit includes a sense amplifier, having a first input, a second input, and an enable input. A first amplifier coupled to an output of a magnetic resistance-based memory cell and a second amplifier coupled to a reference output of the cell also are provided. The circuit further includes a digitally-controllable amplifier coupled to a tracking circuit cell. The tracking circuit cell includes at least one element that is similar to the cell of the magnetic resistance-based memory. The first input of the sense amplifier is coupled to the first amplifier, the second input of the sense amplifier is coupled to the second amplifier, and the enable input is coupled to the third digitally-controllable amplifier via a logic circuit. The sense amplifier may generate an output value based on the amplified values received from the output of the magnetic resistance-based memory cell and the reference cell once the sense amplifier receives an enable signal from the digitally-controllable amplifier via the logic circuit.

21 Claims, 5 Drawing Sheets

DIGITALLY-CONTROLLABLE DELAY FOR SENSE AMPLIFIER

I. FIELD

The present disclosure is generally related to reading data stored in a random access memory (RAM) device.

II. DESCRIPTION OF RELATED ART

Sense amplifiers are used to read data stored in resistance-based memory devices, such as magnetic random access memory (MRAM) devices. Typically, in MRAM devices, a first analog amplifier amplifies an output value of a selected MRAM cell and a second analog amplifier amplifies an output of a reference cell. The sense amplifier compares the received output values. Depending on the output of the MRAM cell relative to the output of the reference cell, the sense amplifier determines whether the output of the MRAM cell should be read as a high value or a low value, and generates a high output or a low output, respectively, capable of being read by digital logic circuits.

There generally is a delay from a time when a read operation of an MRAM cell is initiated to a time when the value can be accurately read by the digital sense amplifier. When the read operation is initiated, the analog amplifiers reading the selected MRAM cell and the reference cell generate similar outputs that diverge after a short delay, indicating whether the output of the MRAM cell should be determined to be a high level output or a low level output. When the digital sense amplifier compares the outputs too soon after the read operation is initiated, the selected MRAM cell output and the reference output may not have sufficiently diverged to enable accurate reading of the data value represented in the selected memory cell. On the other hand, delaying the comparison at the digital sense amplifier longer than appropriate to allow the outputs of the analog amplifiers to diverge slows performance of the memory device.

III. SUMMARY

In a particular embodiment, a circuit for use in applying a controlled delay in reading data is disclosed. The circuit includes a sense amplifier, having a first input, a second input, and an enable input. A first amplifier coupled to an output of a magnetic resistance-based memory cell and a second amplifier coupled to a reference output of the cell also are provided. The circuit further includes a digitally-controllable amplifier coupled to a tracking circuit cell. The tracking circuit cell includes at least one element that is similar to the cell of the magnetic resistance-based memory. The first input of the sense amplifier is coupled to the first amplifier, the second input of the sense amplifier is coupled to the second amplifier, and the enable input is coupled to the third digitally-controllable amplifier via a logic circuit. The sense amplifier may generate an output value based on the amplified values received from the output of the magnetic resistance-based memory cell and the reference cell once the sense amplifier receives an enable signal from the digitally-controllable amplifier via the logic circuit.

In another particular embodiment, an apparatus is disclosed that includes a tracking cell. The tracking cell includes a magnetic random access memory (MRAM) cell disposed in an MRAM array in which the MRAM array including a plurality of MRAM cells. A tracking amplifier includes an analog amplifier configured to receive an output of the tracking cell. A controllable delay circuit is configured to receive a digital control signal to control timing of an output of the tracking amplifier based on the received digital control signal.

In still another embodiment, a method of timing an enable signal used to initiate reading of data values in a magnetic random access memory (MRAM) device is disclosed. An MRAM device including a plurality of memory cell circuits is configured to include at least one MRAM tracking cell circuit. The tracking circuit includes at least one MRAM tracking cell. The MRAM tracking cell is configured to generate an MRAM tracking cell output in response to receiving a read signal applied at the MRAM device. The tracking circuit also includes a tracking amplifier in the MRAM device to respond to the MRAM tracking cell output. Based on the MRAM tracking cell output, the tracking amplifier, after a selective delay, generates a tracking signal that is used to initiate the enable signal.

One particular advantage provided by embodiments disclosed herein enables a controlled delay to be imposed in reading data from magnetic resistance-based memory cells to enable the data to be read accurately without imposing an unnecessarily long read delay. Another particular advantage provided by embodiments disclosed herein is improved yield of MRAM devices by including a controllable delay device to be programmed to enable MRAM devices to achieve an acceptable error rate in spite of process variations.

Other aspects, advantages, and features of the present disclosure will become apparent after review of the entire application, including the following sections: Brief Description of the Drawings, Detailed Description, and the Claims.

V. DETAILED DESCRIPTION

Figure 1:
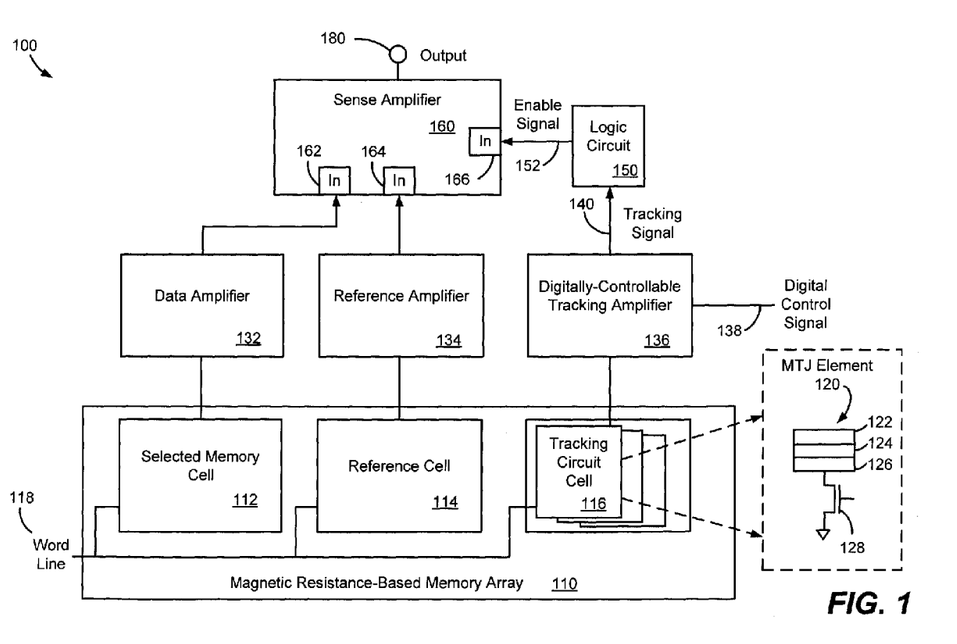
FIG. 1 is a block diagram of a particular illustrative embodiment of a system to apply a digitally-controllable delay for a sense amplifier.

FIG. 1 is a block diagram of a particular illustrative embodiment of a system, generally designated 100, with a digitally-controllable delay for a sense amplifier. The system 100 includes a magnetic resistance-based memory device, such as a magnetic random access memory (MRAM) array 110. The system 100 further includes analog amplifiers 132-136, a logic circuit 150 and a sense amplifier 160. An output 180 of the sense amplifier 160 presents a stored value read an output from a cell, such as a selected memory cell 112, in the MRAM array 110.

In a particular illustrative embodiment, the MRAM array 110 includes a plurality of memory cells, reference cells, and tracking circuit cells. For the sake of illustration, the MRAM array 110 is depicted as having a single selected memory cell 112, a reference cell 114, and one or more tracking circuit cells 116. In a particular embodiment, the selected memory cell 112 and the tracking circuit cells 116 each include a passive element and an active element. The selected memory cell 112 and the tracking circuit cells 116, for example, include a passive element including a magnetic tunnel junction (MTJ) element 120 and an active element including an access transistor 128. The MTJ element 120 includes a free layer 122, a tunnel barrier 124, and a fixed layer 126, the operation of which is further described below with reference to FIG. 3. When a word line 118 presents an appropriate signal to cause MRAM cells in a particular row to become accessible, values stored at the selected memory cell 112 and the reference cell 114 are made available to a first amplifier, which includes a data amplifier 132, and a second amplifier, which includes a reference amplifier 134, respectively.

Values are stored in MTJ cells or other magnetic resistance-based memory cells by configuring the cells to have a high resistance or a low resistance to represent a high data bit value or a low data bit value, respectively. When a current is applied to the cells, a cell configured to have a high resistance value will present a higher output voltage than a cell configured to have a low resistance value. A sense amplifier, such as the sense amplifier 160, reads the voltages produced by the cells in comparison with voltages produced by reference cells having a known resistance level. Typically, the resistance value of the reference cells is an average of the high and low resistance values. Thus, when a current is applied to the data cell and the reference cell, if the voltage output of the data cell is higher than that of the reference cell, the data cell is considered to represent a high data value. On the other hand, if a current is applied to the data cell and the reference cell and the voltage output of the data cell is lower than that of the reference cell, the data cell is considered to represent a low data value. By comparing the output of the cells with the memory cells, it is determined to what resistance value each cell is configured and, thus, what data values are stored at the cells.

When a current is applied to the selected memory cell 112 and the reference cell 114, the data amplifier 132 and the reference amplifier 134 amplify the output values of the selected memory cell 112 and the reference cell 114, respectively. The amplified values generated by the data amplifier 132 and the reference amplifier 134 are presented to the sense amplifier 160. The sense amplifier 160 includes a first input and a second input, which in the embodiment shown in FIG. 1, include a data input 162 and a reference input 164, as well as an enable input 166.

In a particular embodiment, the sense amplifier 160 generates a signal at the output 180 indicating whether the selected memory cell 112 stores a high value or a low value based on comparing the amplified values generated by the data amplifier 132 and the reference amplifier 134 received at the data input 162 and the reference input 164, respectively. For example, when the amplified values generated by the data amplifier 132 and the reference amplifier 134 diverge by at least a threshold amount, and the value generated by the data amplifier 132 is greater than that generated by the reference amplifier 134, the selected memory cell 112 is determined to represent or store a high data value. On the other hand, when the amplified values generated by the data amplifier 132 and the reference amplifier 134 diverge by at least the threshold amount and the value generated by the data amplifier 132 is less than the value generated by the reference amplifier 134, the selected memory cell 112 is determined to represent or store a low data value. The result of the comparison by the sense amplifier 160 is presented as the output 180 when the sense amplifier 160 receives an enable signal 152 at an enable input 166 of the sense amplifier 160.

Whether the sense amplifier 160 determines that the amplified values generated by the data amplifier 132 and the reference amplifier 134 diverge by a threshold amount may be a function of when the sense amplifier 160 compares the amplified values generated by the data amplifier 132 and the reference amplifier 134. If the sense amplifier 160 compares the data values generated by the data amplifier 132 and the reference amplifier 134 too soon, the values may not have diverged sufficiently to determine whether the data value should be classified as a high value or a low value. The output of the data amplifier 132 and the reference amplifier 134 should be permitted a delay sufficient to permit a signal divergence time adequate to enable sufficient divergence of the output values prior to the sense amplifier 160 performing the comparison to determine what value is presented by the selected memory cell 112. On the other hand, if the delay permitted is longer than it takes the outputs of the data amplifier 132 and the reference amplifier 134 to diverge, a resulting memory access time allowed may be too long and thus a speed performance of the system 100 may be unnecessarily reduced. This behavior is further described with reference to FIG. 2.

A third amplifier includes a digitally-controllable tracking amplifier 136 that is programmable to adjust a delay of the sense amplifier 160 via the enable signal 152. The digitally-controllable tracking amplifier 136 receives an output value of a tracking circuit cell 116 or an average of the output of a plurality of tracking circuit cells 116. In a particular embodiment, the digitally-controllable tracking amplifier 136, like the data amplifier 132 and the reference amplifier 134, is a fabricated component within an MRAM device. The fabricated components may have different time responses as a result of variations in the fabrication of the device between lots or due to variations from design estimates. Using the tracking circuit cell 116 as described further below, a responsiveness of the digitally-controllable tracking amplifier 136 may be determined to allow enough time for amplified data values to be reliably read by the sense amplifier 160. In a particular embodiment, the tracking circuit cell 116 is designed to duplicate the selected memory cell 112 and the reference cell 114 to track or substantially duplicate performance of the selected memory cell 112 and the reference cell 114.

Once a time response of the digitally-controllable tracking amplifier 136 is determined, which may reflect the time response of the data amplifier 132 and the reference amplifier 134 as well, a digital control signal 138 may be set to control timing of a tracking signal 140 generated by the digitally-controllable tracking amplifier 136. The tracking signal 140 is amplified by a logic circuit 150, which may include, for example, a pair of inverters connected in series, operable to generate an enable signal 152 at a level operable to control a digital input. The enable signal 152 is received by an enable input 166 of the sense amplifier 160. Thus, when the enable signal 152 reaches an enable level, after a known delay to allow the amplified data values generated by the data amplifier 132 and the reference amplifier 134 to approach stable values, the sense amplifier 160 generates a signal at the output 180 reflecting the data value stored in the selected memory cell 112. The known delay may include a combination of the logic circuit 150 propagation delay combined with the delay of the digitally-controllable tracking amplifier 136 set by the digital control signal 138.

Figure 2:
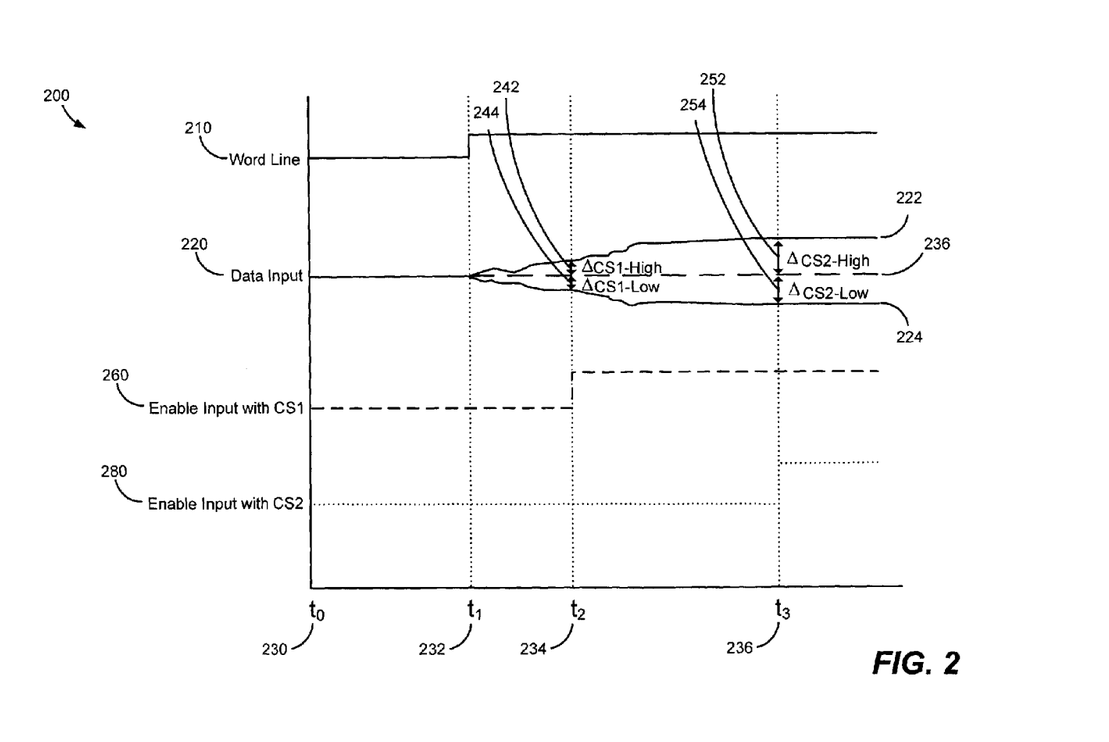
FIG. 2 is a graph representing output levels of a particular illustrative embodiment of analog amplifiers reading outputs of memory cells cell storing high and low values, in which a sense amplifier is enabled to read the output of the memory cell at different times.

To illustrate a result of the delay determining when the sense amplifier 160 compares amplified values generated by the data amplifier 132 and the reference amplifier 134, FIG. 2 depicts a graph representing output levels of a particular illustrative embodiment of analog amplifiers reading outputs of memory cells storing high and low values, in which a sense amplifier is enabled to read the output of the memory cell at different times.

In the example of FIG. 2, the stored data value is a high value relative to a low value stored in a reference cell. The graph 200 shows values of the word line signal 210 and the data input signal 220 to a sense amplifier, such as the sense amplifier 160 of FIG. 1. The data input signal 220 represents the amplified values generated by amplifiers, such as the data amplifier 132 (FIG. 1) and the reference amplifier 134 over time. The time intervals shown range from $t_0$ 230, to $t_1$ 232, to $t_2$ 234, through $t_3$ 236. In one particular embodiment, from $t_0$ 230 to $t_1$ 232, the data input signal 220 is equal to the reference value 236 which represents an average of a high value and a low value. At time $t_1$ 232, when the word line signal 210 is initiated reading of selected memory cells, for example, the data input signal 220 begins to change. The data input signal 220 increases toward a higher voltage value 222 when the represented value (as determined by its resistance in response to an applied current, as previously described) of the selected memory cell is a high value. By contrast, the data input signal 220 decreases toward a lower voltage value 224 when the represented value of the selected memory cell 112 is a low value. Depending on whether the sense amplifier 160 is enabled to compare the amplified values in response to a first control signal (CS1) or in response to a subsequent, second control signal (CS2), the sense amplifier 160 may yield different values at the output 180 for the stored data value.

For example, at time $t_1$ 232, the word line signal 210 transitions to a high value, causing the data value represented by the selected memory cell 112 to be read. As a result of the word line signal 210 changing to a high value at $t_1$ 232, the value represented by the selected memory cell 112 and the reference cell 114 are made accessible and coupled to the analog amplifiers 132 and 134. The amplified values represented by the data input signal 220 begin to change toward the high value 222 or the low value 224 depending on the value represented by the selected memory cell 112.

By $t_2$ 234, when the selected memory cell 112 represents a high data value, the data input signal 220 diverges from the reference value 236 by a separation of $\Delta_{CS1-High}$ 242. When the selected memory cell 112 represents a low data value, the data input signal 220 diverges from the reference value 236 by a separation of $\Delta_{CS1-Low}$ 244. For purposes of this example, it is assumed that the separations of $\Delta_{CS1-High}$ 242 and $\Delta_{CS1-Low}$ 244 fall within an indeterminate range too small to be reliably read by a sense amplifier such as the sense amplifier 160 of FIG. 1, Thus, if an enable input 260 with CS1 at $t_2$ 234 is used as the enable input of the sense amplifier 160, a high value may be mistakenly read as a low value, while a low value may be mistakenly read as a high value.

In contrast, by $t_3$ 236, when a high data value is represented by the selected memory cell 112, the data input signal 220 diverges from the reference value 236 by a separation Of $\Delta_{CS2-High}$ 252, which, for purposes of example, is assumed to exceed a separation that enables the sense amplifier 160 to reliably read the data input signal 220 as a high value. Similarly, by $t_3$ 236, when a low data value is represented by the selected memory cell 112, the data input signal 220 diverges from the reference value 236 by a separation of $\Delta_{CS2-Low}$ 254, which, for purposes of example, is assumed to exceed a separation that enables the sense amplifier 160 to reliably read the data input signal 220 as a low value. Thus, if an enable input 280 with CS2 at $t_3$ 234 is used as the enable input of the sense amplifier 160, the sense amplifier 160 will be able to accurately read whether the data input signal is a low value or a high value.

As illustrated in FIG. 2, if the sense amplifier 160 is enabled before the data values can reach an adequate degree of separation, the data values may be misread. If the sense amplifier is enabled at a later time, the data values can reach a greater degree of separation and the sense amplifier 160 will be able to more reliably read the data values; however, time performance will be sacrificed if too long a time is allowed to pass before enabling the sense amplifier 160. Particular embodiments disclosed use the tracking circuit cells 116 to determine a responsiveness of the memory device, including its memory cells and amplifiers, to determine when data values may be reliably read. Then, a digitally-controllable tracking amplifier 136 may be configured using the digital control signal 138 to set when the enable signal is applied to the sense amplifier 160 to balance reliability and time performance.

Figure 3:
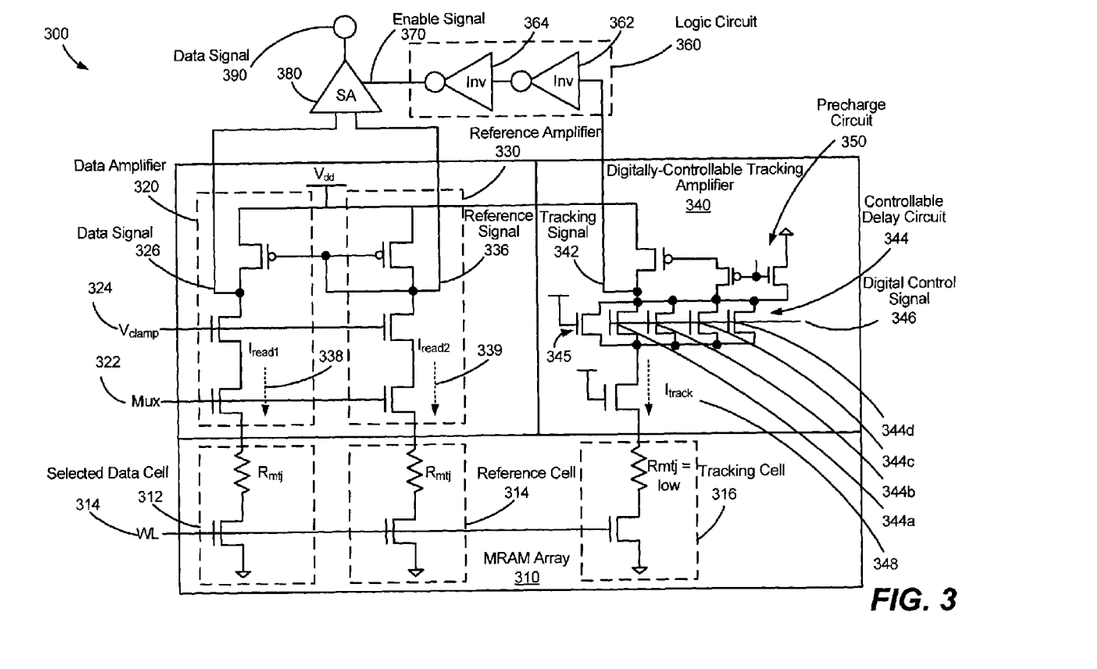
FIG. 3 is a schematic diagram of a particular illustrative embodiment of a memory device configured to selectively delay generation of an enable signal to read data values.

FIG. 3 is a schematic diagram of a particular illustrative embodiment of a memory device 300 configured to selectively delay generation of an enable signal to read data values. The memory device 300 includes an MRAM array 310, a data amplifier 320, a reference amplifier 330, a digitally-controllable tracking amplifier 340, a logic circuit 360, and a sense amplifier 380 configured to generate a data signal 390. As in the case of the block diagram of FIG. 1, although such a system may include a plurality of data cells, reference cells, tracking cells, amplifiers, and other devices, for sake of example, only a single selected data cell 312, a single reference cell 314, a single tracking cell 316, a single data amplifier 320, a single reference amplifier 330, a single digitally-controllable tracking amplifier 340, a single logic circuit 360, and a single sense amplifier 380 are shown and described. As in the system 100 of FIG. 1, an enable signal 370 causes data values to be compared to reference signals at the sense amplifier 380 to generate the data signal 390. The enable signal 370 is generated by the logic circuit 360 based on a tracking signal 342 generated by the digitally-controllable tracking amplifier 340. Thus, the timing of the enable signal 370 may be directed by the digitally-controllable tracking amplifier 340 as a result of a digital control signal 346 applied to a controllable delay circuit 344.

The data amplifier 320 and the reference amplifier 330 each include a load device, such as p-channel metal-oxide-semiconductor (PMOS) transistor, coupled to a clamping transistor and a selection transistor. A clamp voltage $V_{clamp}$ 324 is applied to a control terminal of the clamp transistors to limit a read current $I_{read1}$ 338 through the data amplifier 320 and a read current $I_{read2}$ 339 through the reference amplifier 330. A cell selection signal 322 is applied to a control terminal of a selection transistor, such as transistor of a multiplexer, to selectively couple the selected data cell 312 to the data amplifier 320 and to couple the reference cell 314 to the reference amplifier 330.

The selected data cell 312 includes a magnetic tunnel junction (MTJ) element coupled to an access transistor. The MTJ element stores a data value according to a resistance exhibited by the MTJ element as a result of a free layer of the MTJ having a magnetic moment in a parallel or anti-parallel orientation to a fixed layer of the MTJ. For purposes of illustration, the MTJ element is represented as a resistor (Rmtj) that may represent either a logical high value or a logical low value.

A data read operation is performed by coupling the data amplifier 320 to the selected data cell 312 by applying an appropriate selection signal 322 to the selection transistor of the data amplifier 320, and by turning on the access transistor of the selected data cell 312 via an appropriate signal at a word line (WL) 314. A resistance of the MTJ element of the selected data cell 312 is reflected in a read current $I_{read1}$ 338 that flows from a supply voltage ($V_{dd}$), though the load device, the clamping transistor, the selection transistor, the MTJ element and the access transistor, to a ground. The clamp voltage $V_{clamp}$ 324 is applied to a control terminal of the clamp transistor to limit the read current $I_{read1}$ 338 to not disturb the data value stored at the selected data cell 312.

A voltage at a node in the data amplifier 320 where the load device is coupled to the clamp transistor is output by the data amplifier 320 as a data signal 326. The data signal 326 may have an initial value as a read operation begins and may settle to a final value based on the data value stored at the selected data cell 312, such as depicted at 220 of FIG. 2. An amount of time required to settle to a final value may vary depending on the strength of the clamping transistor, and the data signal 326 may also be affected by factors such as process variations and thermal noise.

As previously described, there is a delay between a time when the values stored in the selected data cell 312 and the reference cell 316 are made accessible and a time when the values reach a separation level accurately indicating a data value represented by the selected data cell 312. A capacitive charging and inductive effect and resistive effect delay resulting from a configuration of the wires and transistors also causes a delay in a logical voltage level transition of the tracking signal 342 and the enable signal 370. If the design and fabrication of the system 300 provide adequate separation to accurately read the stored data value before a transition of the tracking signal 342 is generated, then it may be determined that no additional delay is required before enabling the sense amplifier 380 to reliably read the data values. However, in the event that a further delay to permit additional separation is appropriate, the digital control signal 346 may engage the controllable delay circuit 344 to delay the digitally-controllable tracking amplifier 340 from presenting the tracking signal 342 that initiates the enable signal 370.

In one particular embodiment, the controllable delay circuit 344 includes a clamping circuit including a plurality of clamping transistors 344a-344d and an always-on clamping transistor 345 with commonly-coupled sources and commonly-coupled drains. The digital control signal 346 includes a series of bits configured to selectively activate gates of selected transistors among the plurality of clamping transistors 344a-344d. For the sake of visual simplicity, it is assumed that the digital control signal includes a multi-bit bus configured to selectively apply a one-bit control signal to a gate of each of the plurality of clamping transistors 344a-344d of the controllable delay circuit 344. In a physical implementation of the memory device 300, external pins may be included to receive each of the bits of the digital control signal 344 or a number of pins may receive values that may be decoupled to represent each of a number of combinations of the digital control signal 344. Alternatively, when no external pins are provided on the memory device 300 to receive the digital control signal 344, bits of the digital control signal 344 may be tied to other known bit values selectable by controlling the configuration and use of the memory device.

As shown in the particular embodiment shown in FIG. 3, the plurality of clamping transistors 344a-344d and the clamping transistor 345 are interposed in parallel in the digitally-controllable tracking amplifier 340 at equivalent points to which the clamping transistors that receive $V_{clamp}$ 324 are interposed in the data amplifier 320 and the reference amplifier 330. The clamping transistors 344a-344d and 345 may each be designed to be substantially similar to the clamp transistors of the data amplifier 320 and the reference amplifier 330. Selectively enabling a number of the clamping transistors 344a-344d alters the delay in generating a voltage change in the tracking signal 342 sufficient to be recognized at an input to the logic circuit 360 after the word line WL 314 is activated.

Turning off all of the clamping transistors 344a-344d, such as by applying a digital control signal 346 of "0000," results in the shortest programmable delay in the configuration of the controllable delay circuit 344. As a result, a voltage transition of the tracking signal 342 will be generated after the least possible delay from the controllable delay circuit 344 at or after the time that a read signal at the word line WL 314 is applied. Thus, if it is determined that minimal or no additional delay from the controllable delay circuit 344 is appropriate, a digital control signal 346 of "0000" may be applied to the controllable delay circuit.

Alternatively, if it is determined that a further delay should be interposed to allow outputs of the data amplifier 320 and the reference amplifier 330 to reach stable and sufficiently divergent levels, the digital control signal 346 applied to the controllable delay circuit 344 may be adjusted to provide the further delay. For example, by activating all of the plurality of clamping transistors 344a-344d, such as by applying a digital control signal of "1111" a longest possible delay from the controllable delay circuit 344 before a voltage transition of the tracking signal 342 is generated. Correspondingly, applying other permutations of four-bit codes to the digital control signal 346 may result in a selectable range of different delays. A further range of selectable delays may be made available by increasing or decreasing a number of transistors included in the controllable delay circuit 344.

$I_{track}$ 348 may exceed a critical current required to change the data value at the tracking cell 316. However, the data value at the tracking cell 316 may be set to a low value so that, if $I_{track}$ 348 exceeds the critical current, a logical low value will be written to the tracking cell 316 without impairing an operation of the tracking circuit.

In a particular embodiment, the controllable delay circuit 344 includes a precharge circuit 350. The precharge circuit 350 enables an output of the controllable delay circuit 344 to be precharged to a predetermined level, such as a ground or logical low value. In the illustrated embodiment, a high control value applied to the precharge circuit 342 decouples the gate of the load PMOS and holds the tracking signal 342 at ground. When the control value applied to the precharge circuit transistions to a low value, the load PMOS is recoupled in a diode connected configuration and the tracking signal 342 is released from ground. Because the tracking cell 316 stores a low value, the voltage level of the tracking signal 342 will increase from a logical low to a logical high value that is detectable as a low to high transition at an input to the logic circuit 360, at a rate influenced by the number of activated clamp transistors 344a-344d.

Once the separation characteristics of a device or group of devices is determined, the digital control signal 346 may be set to control the timing of applying the enable signal 370 to the sense amplifier 380. As previously described, it is desirable that a delay be applied, if needed, to allow the data signal 326 output of the data amplifier 320 and the reference signal 336 output of the reference amplifier 330 to reach a separation for the sense amplifier 380 to accurately read the stored data value represented in the selected data cell 312. Thus, the digital control signal 346 should be set to allow for accurate reading of the stored data values. On the other hand, the digital control signal 346 should be set so as not to unduly slow the memory retrieval process. Empirical analysis of known stored values may be used to select an appropriate digital control signal 346.

For example, in selecting an appropriate digital control signal 346, in the digital control signal 346 may be initially set to apply a largest possible delay in generating a logical transition of the tracking signal 342. The memory device 300 may then be tested by applying codes as the digital control signal 346 that result in successively shorter delays until erroneous data values are read in excess of a selected error rate. At this point, codes applied as the digital control signal 346 may then be changed to increase the applied delay by a selected amount intended to reduce a number of data read errors below the acceptable error rate. The acceptable error rate may be as low as zero (0) errors or may permit a specified number of data read errors.

By including the controllable delay circuit 344, manufacturing yield of the memory device 300 may be improved. In a memory device that does not include a delay device or that includes a non-adjustable delay device, the resulting error rate in reading data values may reach or exceed a threshold amount in the memory device (barring a number of memory devices included in a particular manufacturing lot) may have to be discarded. In contrast to memory devices that include no delay device or a nonadjustable delay device, embodiments of the memory device 300 herein disclosed may enable an adjustment to be made in delaying reading of memory cells such that the memory device exhibits an error rate within allowable levels.

Once the tracking signal 342 is generated, the tracking signal 342 is applied to the logic circuit 360 which, in one particular embodiment, includes a first inverter 362 and a second inverter 364 connected in series to amplify the high or low data value supplied by the tracking signal 342. The first inverter 362 inverts the tracking signal 342 and transitions form a logical high output to a logical low output when the tracking signal 342 reaches a sufficiently high voltage to be recognized as a logical high input signal. The second inverter 364 receives an output of the first inverter 362 which, in this case, re-inverts the tracking signal 342 to its original logical value and at a voltage level usable by another digital device. Thus, the output of the logic circuit 360 provides a correct, digital-level version of the tracking signal 342 as the enable signal 370 to the sense amplifier 380. The logic circuit 360 may impose a propagation delay in converting the tracking signal 342 into the enable signal 370. This propagation delay of the logic circuit 360 may be considered in setting the digital control signal 346 because the propagation delay will add to the delay imposed by the controllable delay circuit 344.

Figure 4:
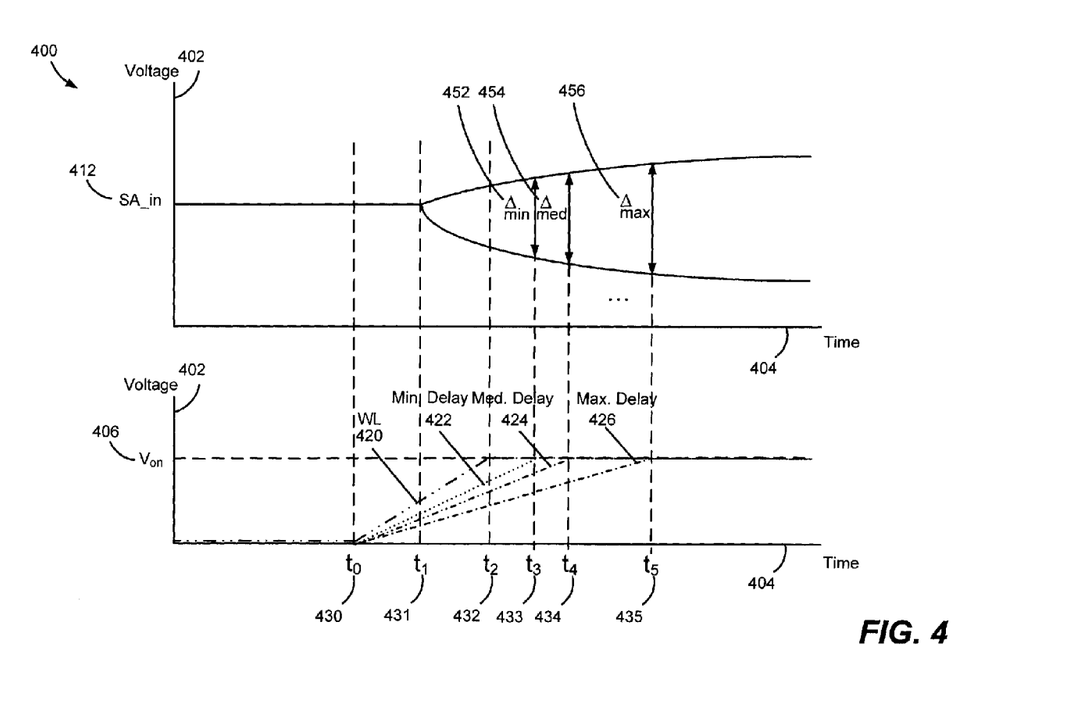
FIG. 4 is a pair of graphs depicting sense amplifier data inputs read following various exemplary selectable delays after activation of a word line signal.

FIG. 4 is a pair of graphs depicting sense amplifier data inputs read following various exemplary selectable delay periods after activation of a word line signal. In particular, FIG. 4 shows a graph 400 representing how an enable signal, selectively delayed, for example, by the controllable delay circuit 344, affects the inputs received by (and thus the data output of) a sense amplifier, such as the sense amplifier 380 of FIG. 3. For ease of illustration, it is assumed that the sense amplifier will be presented with inputs from a data cell storing a high value and a reference cell storing a low value, thus, the desired output of the sense amplifier is a high value. For a high value output to issue from the sense amplifier, the inputs have to diverge or separate between the data value and the reference value by at least a threshold amount as previously described with reference to FIG. 2. The graph 400 illustrates general behaviors that have simplified for ease of illustration, and may not necessarily be shown to scale or otherwise interpreted as limiting the scope of the present disclosure.

The graph 400 plots voltage, on corresponding dependent, vertical axes 402, against time on corresponding independent, horizontal axes 404. The graph 400 shows a $V_{on}$ threshold level 406 showing a threshold at which, for example, an enable input would be successfully triggered or at which a first digital inverter input reaches a sufficiently high level to cause its output to drop to a low level (and, in turn, cause a second digital inverter receiving an output of the first digital inverter to cause its output to rise to a high, digital-level voltage value as shown in the logic circuit 360 of FIG. 3). The graph 400 also shows a plurality of triggering signals, including a word line (WL) signal 420 and a plurality of delayed enabling signals to the sense amplifier, including a minimum delay enable signal 422, a medium delay enable signal 424, and a maximum delay enable signal 426 representing exemplary delayed enable signals that may be generated according to particular embodiments as described with reference to FIG. 3. The plurality of delayed enabling signals 422-426 may represent the tracking signal 342 with the graph 400 being used to evaluate selection of an appropriate enable signal irrespective of a delay added by the logic circuit 360 or, alternatively, incorporating a delay added by the logic circuit 360.

For example, the minimum delay enable signal 422 may represent a delay resulting in the application of the enable signal when each of the plurality of clamping transistors 344a-344d is turned off with a digital control signal 346 of "0000." The medium delay 424 may represent a delay resulting when, for example, half of the plurality of clamping transistors 344a-344d are activated, such as by using a digital control code 346 of "1100," "0011," or a similar permutation of a four-bit code. The maximum delay 426 may represent a delay resulting when all of the plurality of clamping transistors 344a-344d are activated, such as by using a digital control code of "1111."

The graph 400 shows a state of an SA_in input 412 at varying times to illustrate advantages of being able to selectably or controllably delay the enable signal to the sense amplifier. At $t_0$ 430, the WL signal 420 begins to transition to a high or active level, which initiates data values stored in selected memory cells becoming accessible as described with reference to FIG. 3. At $t_1$ 431, the WL signal 420 reaches a level in which signals have begun to propagate through the memory cells and analog amplifiers for the values presented to the sense amplifier by SA_in 412 to begin to diverge or separate.

At $t_2$ 432, the WL signal 420 reaches the $V_{on}$ threshold 406. At $t_2$ 432, the SA_in signal 412 has diverged little. Thus, if the WL signal 420 reaching a high level were used to enable the sense amplifier, the sense amplifier may mistakenly read the represented value and erroneously generate an erroneous data output.

At $t_0$ 430, with the WL signal 420 transitioning to a high level, the delayed enable signals 422, 424 and 426 begin to transition to high level values. The minimum delay signal 422 reaches the $V_{on}$ threshold 406 at $t_3$ 433 where the separation of SA_in 412 is $\Delta_{min}$ 452. The medium delay signal 424 reaches the $V_{on}$ threshold 406 at $t_4$ 434 where the separation of SA_in 412 is $\Delta_{med}$ 454. The maximum delay signal 426 reaches the $V_{on}$ threshold 406 at $t_5$ 435 where the separation of SA_in 412 is $\Delta_{max}$ 456. Evaluating the separation of SA_in 412 as each of the delayed enable signals reaches $V_{on}$ 406, it can be determined what choice of delayed enable signal and corresponding digital delay signal provides an appropriate balance between reading accuracy and memory read delay. A longer delay generally results in greater separation, but any desirable tradeoff between accuracy and speed may be selected.

Figure 5:
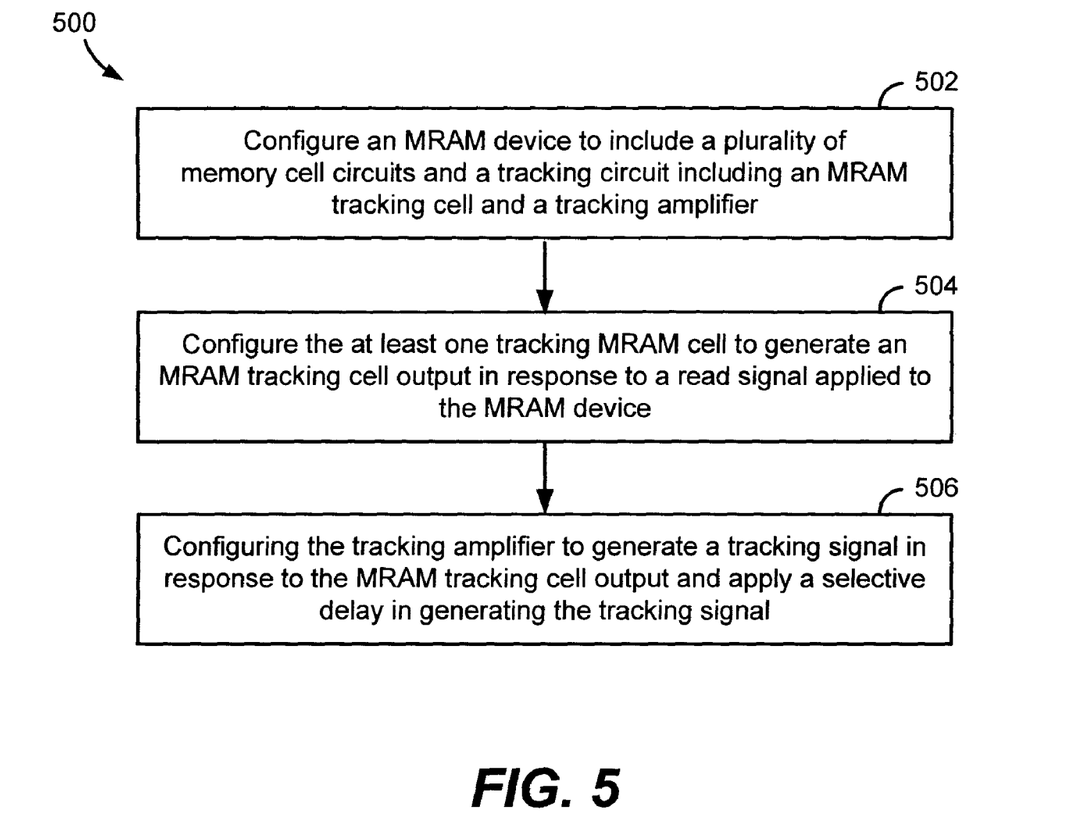
FIG. 5 is a flow chart of a particular illustrative embodiment of controlling a delay in generating a tracking signal configured to initiate an enable signal to read values from an MRAM device.

FIG. 5 is a flow chart 500 of a particular illustrative embodiment of controlling a delay in generating a tracking signal configured to initiate an enable signal to read values from an MRAM device. At 502, an MRAM device is configured to include a plurality of memory cells and a tracking circuit including an MRAM tracking cell and digitally-controllable tracking amplifier. At 504, the at least one MRAM tracking cell is configured to generate an MRAM tracking cell output in response to a read signal applied to the MRAM device. At 506, the digitally-controllable amplifier is configured to generate the tracking signal in response to the MRAM cell tracking output and apply a selective delay in generating the tracking signal.

According to particular embodiments of the method of FIG. 5, the tracking signal may be coupled to an enable input of a sense amplifier configured to read data values from the plurality of memory circuits of the MRAM device. The tracking signal may be coupled to the enable input of the sense amplifier through a logic circuit configured to generate a digital signal voltage corresponding to a level of the tracking signal. According to other particular embodiments, the selective delay in generating the tracking signal based on a response of the tracking circuit in response to the read signal, where the response of the tracking circuit is considered to be representative of a response of the memory cell circuits of the MRAM device. The digitally-controllable amplifier may receive a digital control signal that is configured to control the selective delay applied by the digitally-controllable tracking amplifier. In one embodiment, the digitally-controllable tracking amplifier may include a clamping circuit that causes the tracking circuit to apply the selective delay in response to the digital control signal. Also, in another particular embodiment, the tracking circuit may include a plurality of MRAM tracking cells. Each of the MRAM tracking cells presents an individual MRAM tracking cell output. The individual MRAM tracking cell output of each of the plurality of MRAM tracking cells is averaged to produce the MRAM tracking cell output received by the digitally-controllable tracking amplifier.

Those of skill would further appreciate that the various illustrative logical blocks, configurations, modules, circuits, and algorithm steps described in connection with the embodiments disclosed herein may be implemented as electronic hardware, computer software, or combinations of both. To clearly illustrate this interchangeability of hardware and software, various illustrative components, blocks, configurations, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such embodiment decisions should not be interpreted as causing a departure from the scope of the present disclosure.

The steps of a method or algorithm described in connection with the embodiments disclosed herein may be embodied directly in hardware, in a software module executed by a processor, or in a combination of the two. A software module may reside in random access memory (RAM), flash memory, read-only memory (ROM), programmable read-only memory (PROM), erasable programmable read-only memory (EPROM), electrically erasable programmable read-only memory (EEPROM), registers, hard disk, a removable disk, a compact disc read-only memory (CD-ROM), or any other form of storage medium known in the art. An exemplary storage medium is coupled to the processor such that the processor can read information from, and write information to, the storage medium. In the alternative, the storage medium may be integral to the processor. The processor and the storage medium may reside in an device or a user terminal. In the alternative, the processor and the storage medium may reside as discrete components in a computing device or user terminal.

The previous description of the disclosed embodiments is provided to enable any person skilled in the art to make or use the disclosed embodiments. Various modifications to these embodiments will be readily apparent to those skilled in the art, and the principles defined herein may be applied to other embodiments without departing from the scope of the disclosure. Thus, the present disclosure is not intended to be limited to the embodiments shown herein but is to be accorded the widest scope possible consistent with the principles and novel features as defined by the following claims.

What is claimed is:

1. A circuit for use with a magnetic resistance-based memory, the circuit comprising:
   a sense amplifier having a first input, a second input, and an enable input;
   a first amplifier coupled to an output of a cell of the magnetic resistance-based memory;
   a second amplifier coupled to a reference of the output of the cell; and
   a third digitally-controllable amplifier coupled to a tracking circuit cell that includes at least one element that is similar to the cell of the magnetic resistance-based memory,
   wherein the first input is coupled to the first amplifier, the second input is coupled to the second amplifier, and the enable input is coupled to the third digitally-controllable amplifier via a logic circuit.

2. The circuit of claim 1, wherein the tracking circuit cell includes at least one passive component and at least one active component corresponding to passive components and active components included in operative cells in the magnetic resistance-based memory.

3. The circuit of claim 1, wherein the tracking circuit cell includes multiple tracking cells disposed throughout the magnetic resistance-based memory.

4. The circuit of claim 1, wherein the third digitally-controllable amplifier includes a controllable delay circuit coupled to the enable input of the first amplifier.

5. The circuit of claim 4, further comprising a logic circuit configured to receive an output of the controllable delay circuit and to provide a delayed enable signal to the enable input of the sense amplifier.

6. The circuit of claim 4, wherein a delay introduced at the controllable delay circuit is selectable to balance a signal divergence time and a memory access time.

7. The circuit of claim 1, wherein the third digitally-controllable amplifier comprises a precharge circuit configured to set an output voltage level of the controllable delay circuit.

8. An apparatus, comprising:
   a tracking cell including a magnetic random access memory (MRAM) cell disposed in an MRAM array, the MRAM array including a plurality of MRAM cells;
   a tracking amplifier including an analog amplifier configured to receive an output of the tracking cell; and
   a controllable delay circuit configured to receive a digital control signal to control timing of an output of the tracking amplifier based on the received digital control signal.

9. The apparatus of claim 8, wherein the tracking cell is configured to be precharged to a known voltage to establish a reference voltage for the tracking amplifier.

10. The apparatus of claim 8, wherein the digital control signal is selected based on a response of the tracking amplifier to the output of the tracking cell.

11. The apparatus of claim 10, further comprising a plurality of tracking cells coupled to the tracking amplifier and not used for the storage of data, wherein the digital control signal is selected based on an average response of the plurality of tracking cells.

12. The apparatus of claim 8, wherein the controllable delay circuit includes a plurality of clamping transistors operatively coupled with the tracking amplifier, each clamping transistor of the plurality of clamping transistors being responsive to one of a plurality of bits included in the digital control signal to delay the output of the tracking amplifier.

13. The apparatus of claim 8, further comprising a logic circuit configured to amplify the output of the tracking amplifier to generate an enable signal.

14. The apparatus of claim 13, wherein the logic circuit includes a first signal inverter and a second signal inverter, wherein the first signal inverter receives the output of the tracking amplifier and the second signal inverter receives an output of the first signal inverter.

15. A method for controlling timing of an enable signal used to initiate reading of data values in a magnetic random access memory (MRAM) device, the method comprising:
  configuring an MRAM device including a plurality of memory cell circuits to include a tracking circuit, the tracking circuit including:
    at least one MRAM tracking cell, the at least one MRAM tracking cell being configured to generate an MRAM tracking cell output in response to receiving a read signal applied at the MRAM device; and
    a tracking amplifier configured to generate a tracking signal in response to the MRAM cell tracking output and further configured to apply a selective delay in generating the tracking signal,
  whereby the tracking signal is used to initiate an enable signal.

16. The method of claim 15, further comprising operably coupling the tracking signal to an enable input of a sense amplifier configured to read data values from the plurality of memory cell circuits of the MRAM device.

17. The method of claim 16, further comprising operably coupling the tracking signal to the enable input of the sense amplifier through a logic circuit configured to generate a digital signal voltage corresponding to a level of the tracking signal.

18. The method of claim 15, further comprising determining the selective delay in generating the tracking signal based on a response of the tracking circuit in response to the read signal, wherein the response of the tracking circuit is considered to be representative of a response of the memory cell circuits of the MRAM device.

19. The method of claim 15, wherein the tracking amplifier includes a digitally-controllable amplifier configured to receive a digital control signal, the digital control signal being configured to control the selective delay applied by the digitally-controllable tracking amplifier.

20. The method of claim 19, wherein the digitally-controllable amplifier includes a clamping circuit, the clamping circuit being configured to cause the tracking circuit to apply the selective delay in response to the digital control signal.

21. The method of claim 15, wherein:
  the tracking circuit includes a plurality of MRAM tracking cells, each of the MRAM tracking cells presenting an individual MRAM tracking cell output; and
  the individual MRAM tracking cell output of each of the plurality of MRAM tracking cells is averaged to produce the MRAM tracking cell output received by the tracking amplifier.

\* \* \* \* \*